(12) United States Patent
Crick

(10) Patent No.: US 8,284,904 B2
(45) Date of Patent: Oct. 9, 2012

(54) METHOD FOR PERFORMING A SHIELD INTEGRITY TEST AND FOR ISOLATING TROUBLE IN THE SHIELD USING GRAPHICAL ANALYSIS

(75) Inventor: Robert G. Crick, Ranco Santa Fe, CA (US)

(73) Assignee: Textron Innovations Inc., Providence, RI (US)

( * ) Notice: Subject to any disclaimer, the term of this patent is extended or adjusted under 35 U.S.C. 154(b) by 473 days.

(21) Appl. No.: 12/603,959

(22) Filed: Oct. 22, 2009

(65) Prior Publication Data

US 2010/0097070 A1  Apr. 22, 2010

Related U.S. Application Data

(60) Provisional application No. 61/107,344, filed on Oct. 22, 2008.

(51) Int. Cl.
*H04M 1/24* (2006.01)
*H04M 3/08* (2006.01)
*H04M 3/22* (2006.01)

(52) U.S. Cl. .............. 379/22.03; 379/14.01; 379/15.05; 379/21; 379/24; 324/525

(58) Field of Classification Search .............. 379/1.01, 379/14.01, 10.01, 15.05, 21, 22, 22.02, 22.03, 379/22.07, 22.08, 23, 24, 25, 27.01, 27.03, 379/29.01, 29.05, 29.1, 30; 324/525, 627, 324/551

See application file for complete search history.

(56) References Cited

U.S. PATENT DOCUMENTS

| | | | |
|---|---|---|---|
| 4,112,351 A * | 9/1978 | Back et al. | 324/380 |
| 4,399,402 A | 8/1983 | Pelletier | |
| 4,400,663 A | 8/1983 | May | |
| 5,473,666 A * | 12/1995 | Szczebak et al. | 379/3 |
| 5,889,835 A * | 3/1999 | Estes | 379/22.03 |
| 5,903,156 A * | 5/1999 | Matsumaru et al. | 324/533 |
| 6,011,399 A * | 1/2000 | Matsumaru et al. | 324/538 |
| 6,201,853 B1 | 3/2001 | Butler et al. | |
| 6,516,053 B1 | 2/2003 | Ryan et al. | |
| 7,149,285 B2 | 12/2006 | Kennedy et al. | |
| 7,231,415 B1 * | 6/2007 | Eslambolchi et al. | 709/200 |
| 7,852,780 B1 * | 12/2010 | Eslambolchi et al. | 370/250 |

OTHER PUBLICATIONS

International Search Report which issued in connection with PCT/US2009/061654; Dated Dec. 2, 2009; Four (4) pages.
Written Opinion of the International Searching Authority; Dated Dec. 2, 2009; Four (4) pages.

* cited by examiner

*Primary Examiner* — Binh Tieu
(74) *Attorney, Agent, or Firm* — Clark Hill PLC

(57) ABSTRACT

A method for evaluating the integrity of a cable shield utilizing wideband noise-to-ground measurements is provided. Upon determining that trouble with the cable shield exists, a method s is provided to isolate the location of the trouble with the cable shield. The method utilizes access locations along the cable and therefore does not require opening of the cable shield to isolate the trouble in the shield.

26 Claims, 9 Drawing Sheets

METHOD FOR PERFORMING A SHIELD INTEGRITY TEST AND FOR ISOLATING TROUBLE IN THE SHIELD USING GRAPHICAL ANALYSIS

This application claims the domestic benefit of U.S. Provisional Application Ser. No. 61/107,344 filed on Oct. 22, 2008, which disclosure is hereby incorporated by reference in its entirety.

FIELD OF THE INVENTION

This invention is generally directed to a method for isolating opens in a section of a cable shield, opens in the bonds connecting a first section of cable shield to a second section of cable shield, opens in the bonds connecting the cable shield to earth ground, or opens in the bonds connecting the cable shield to power neutral. This invention applies to telecommunications cables or any cable with internal conductors surrounded by an integral shield.

BACKGROUND OF THE INVENTION

Telephone carriers are rapidly deploying digital Internet Protocol Television (IPTV) service over Fiber to the Node (FTTN) technology. These carriers are utilizing Digital Subscriber Line (DSL) technology such as, for example, ADSL2+ or VDSL2 to modulate and carry the digital IPTV over existing copper pairs. FIG. 1 illustrates portions of a typical telecommunications system used to deploy IPTV service using VDSL technology. The telecommunications system includes feeder cables 21, often called F1 cables, which are in communication with distribution cables 22, often called F2 cables, through a cable cross-connect box 30. Although a typical telecommunications system includes several feeder cables 21 and several distribution cables 22, only one feeder cable 21 and one distribution cable 22 is illustrated. The VDSL system includes a fiber fed node 26, fed by a fiber cable 20, a DSLAM 28 and a cross-connect box 30. A ground connection 29 is provided at the DSLAM 28 and a ground connection 31 is provided at the cross-connect box 30.

The IPTV carriers position the fiber fed node 26 next to a cross-connect box 30. The fiber cable 20 carries signals to and from the fiber fed node 26. Copper jumper cables 32 are used to transmit the signals between the fiber node 26 and the cross-connect box 30. The distribution cables 22 extend from the cross-connect box 30 and transmit signals between the cross-connect box 30 and the network interface device 34 at the subscriber's premise 36. Although a plurality of subscriber premises 36 are typically provided along the distribution cable 22, only one is illustrated in FIG. 1.

As shown in FIG. 2 the distribution cable 22 includes a number of twisted copper pairs 40 (one of which is shown), a cable shield 42 around the pairs 40, and an insulative sheath 44 around the shield 42 Each pair 40 includes a first conductor or tip 46 and a second conductor or ring 48. Referring back to FIG. 1, two pairs of conductors 40 within the distribution cable 22 are shown. A pair 40a of conductors is terminated at the subscriber's premise 36 and other pairs, such as pair 40b, extend beyond the subscriber's premise and are terminated beyond the subscriber's premise.

As illustrated in FIG. 1, the DSLAM 28 includes a DSL modem 50 which communicates with a remote DSL modem 52 located in the network interface device 34 (NID). Although the NID 34 is shown outside of the subscriber's premise 36, alternatively, the NID 34 and remote DSL 52 modem can be located inside the subscriber's premise 36. The interconnection cables 32 carry signals between the DSLAM 26 and the cross-connect-box 30. Digital signals from the fiber feeder cables 20 are routed through the modem 50 of the DSLAM 28. The modem 50 converts the digital IPTV signals to analog DSL signals and passes the analog signals to the twisted pairs 40 of the distribution cables 22. The distribution cables 22 carry the DSL signals the remaining distance to the subscriber premise 36, often termed the "last mile" from the DSLAM 28 to the NID 34. At the subscriber's premise 36 the remote DSL modem 52 converts the analog DSL signals back to digital signals.

A number of access points/access locations 38 are also provided along the distribution cable 22, and can be located in the pedestals as illustrated. Other types of access points, such as for example sidewalk boxes or hand hole accesses in buried cables, or aerial terminals in aerial cable can also be provided. Although not illustrated in order to provide clarity to FIG. 1, each of the twisted pairs in distribution cable 22 extends through the access points 38 spaced along the cable 22 as indicated by the row of pedestals 38 and power grounding illustrated above cable 22. Extension of the cable 22 through the access points 38 is illustrated in FIGS. 3 and 4. A section 58a of the distribution cable 22 extends from a first access point 38a to a second access point 38b. A first end of cable section 58a is provided in an access point 38a and a second end of cable section 58a is provided in the another access point 38b. Sections 58b and 58c of the cable 22 are adjacent section 58a. An end of cable section 58b extends within the first access point 38a and an end of cable section 58c extends within the second access point 38b.

As shown in FIGS. 1 and 3, the distribution cables 22 of the telecommunications system 10 are often positioned proximate power lines 54. The cable sections located proximate the power lines are often described as "exposed" to the power lines 54. Magnetic fields (represented by the circles 60 encompassing the power lines 54 and the distribution cable 22) from these nearby power lines 54 cut through the distribution cable 22, as do fields from many other sources including radio transmitters. As illustrated in FIG. 3, these magnetic fields 60 induce longitudinal AC voltages, i.e. noise, into the cable section 58a of the distribution cable 22 and onto the twisted pairs 40. The induced longitudinal voltages cause one end 62 of a pair 40 (for example, the end proximate the first pedestal 38a) to have voltage with respect to an opposite end 64 of the pair 40 (for example, the end proximate the second pedestal 38b of the pair). If a ground connection 66 is provided from the pair 40 within the first access point 38a to a nearby power neutral 56 in order to ground the pair 40, the opposite end 64 of the pair 40 of the cable section 58 will show AC voltage with respect to ground. A test instrument 68, such as a voltmeter, can be utilized to measure the AC voltage on the pair 40 with respect to ground. A first lead 69 of the test instrument 68 is connected to the pair 40 at the second end of the cable section 58a and the second lead 71 of the test instrument 68 is connected to ground 56 to measure the AC voltage on the pair 40 with respect to ground. The longitudinally induced voltages also appear on the cable shield 42 when the shield is open, as illustrated in FIG. 3 by an open bond between a first location 73a and a second location 73b. The voltage on the open shield section can also be measured with voltmeter 68 by connecting the first lead 69 of the voltmeter to the open bond at the first location 73a and by connecting the second lead 71 to the ground 56.

To minimize longitudinal voltage on the pairs 40, the shield voltage must be shorted out. In order to short out the shield voltage, the opposite ends of the shield 42 of the section 58a of the distribution cable 22 must be connected together, external to the distribution cable 22, through a low resistance path so as to have very low voltage between the ends of the shield 42 of the cable section 58a in the presence of shield current flow. Although shield ground can be used to short out the shield voltage, as noted above, the shield ground must have a low resistance to be effective and typically shield grounds such as ground rods used at the shield are normally too high in resistance to be effective. The neutral 56 of the parallel power lines 54, however, have a much lower resistance and can provide an effective shield ground. The power neutral 56 consists of multiple grounds located throughout the system connected together by the neutral conductor 55. This power neutral system is commonly called the Multi Ground Neutral, MGN.

The use of shield grounding to cancel the induced voltage in the distribution cable 22 is also illustrated in. FIG. 4. As illustrated in FIG. 4, a shield bond 73 is provided between first location 73a and second location 73b within the access point 38b. A power bond 74 in connection with the shield bond 73 provides an effective low resistance shield ground. In order to utilize the power bond 74 as an effective low resistance shield ground, it is important that the power bond 74 extending from telephone cable shield 42 to power neutral 56 and to other low impedance grounds be maintained in addition to maintaining good shield continuity. As shown, section 58a of the distribution cable 22 extends from a first access point 38a to a second access point 38b and has a first end 70 proximate the first access point 38a and a second end 72 proximate the second access point 38b. The shield 42 of the section 58a includes a first end 42a and a second end 42b. The first end 42a of the shield is bonded through a ground bond 74 to the power neutral 56. The second end 42b of the shield of section 58a is bonded through a ground bond 74 to a second power neutral 56. These ground bonds 74 provide an external low resistance connection between the opposite ends 42a, 42b of the shield section. When the first and second ends 42a, 42b of the shield 42 of the cable section 58a of the distribution cable 22 are grounded as described above, a current will flow through the cable shield 42 of the section 58a which circulates hack through the power neutral within that section 58a. This induced shield current produces its own opposing magnetic field, illustrated by the circles 80. The induced current on a properly bonded and grounded shield 42 of the distribution cable section 58a tends to cancel the induced longitudinal noise voltage on the cable pairs 40 in that section 58a of cable 22. The induced shield current on cable section 58a in FIG. 4 can be measured with instrument 77. In contrast, no shield current is flowing in cable section 58a shown in FIG. 3 due to the open in the shield bond between locations 73a and 73b. In addition, due to cancellation of induced noise voltage on the pair 40 in FIG. 4, a low voltage will be measured on the pair 40 by the voltmeter 68 compared to the higher voltage measured on the pair in FIG. 3.

DSL signals are provided at a much high frequency than POTS signals, allowing the DSL signals to be superimposed over a twisted pair 40 carrying analog POTS service without interference between the POTS service and the DSL service. DSL circuits are susceptible to high frequency interference, and field experience has shown that the IPTV circuits may not be reliable unless the cable shields 42 are bonded and grounded all the way from the fiber node DSLAM 28 to the subscriber's premise 36. Cancellation of the longitudinally induced noise voltage in the manner described is more effective at higher frequencies, e.g. frequencies relating to the xDSL bands, than at lower frequencies, e.g. 60 Hz and frequencies relating to the POTS band. Thus, in xDSL circuits, good shield continuity and good shield grounding are critical for xDSL circuits.

Referring to FIG. 1 (with the understanding that although not shown, the cable 22 extends within the access points 38), multiple shield bond points 80 are used to create many sections of the distribution cable 22, allowing cancellation of voltages induced on the pairs 40 within each section. Each section may have a different exposure to the power lines 54. If the shield current on one section having a certain exposure to the power lines 54 is allowed to enter another section having a different power exposure, the shield current may increase the induced longitudinal voltages on the pair 40 rather than cancel the longitudinal voltage on the pairs 40. Therefore, a bond 74 to power neutral is provided at each instance where the power exposure changes.

In some instances, a bad bond 74 or an open shield 42 keeps the induced shield current from flowing to an adjacent section(s) of the distribution cable. FIG. 5 illustrates an example of this situation. Multiple access points 38 (identified as 1-8) are provided along the distribution cable 22, providing sections of the distribution cable 22 identified as sections 58a-58g. At each access point, a power bond 74 is provided to the cable shield 42 to cancel induced voltages. A break/open 82, however, is present in the shield 42 of the distribution cable 22 within the section 58d. As a result of the break/open 82, shield current is not provided on the shield 42 of section 58d. As discussed above, the power lines 54 induce longitudinal voltages onto the pairs 40 of the distribution cable 22. Although these longitudinal voltages will be cancelled in sections 58a, 58b, 58c, 58e, 58f, and 58g due to the shield current in those sections, the longitudinal voltages occurring in section 58d will, however, remain un-canceled due to the shield open 82. The un-canceled longitudinal voltages drive cable distributed capacitance-to-ground to cause longitudinal currents in the pairs 40. If the resistances of the tip and ring of the pair 40 are not precisely equal, i.e. balanced, these longitudinal currents induce metallic voltages into the pair 40. Or, if tip and ring capacitances-to-ground are not precisely equal, the longitudinal voltage is capacitively coupled metallic into the pair. These longitudinal voltages and longitudinal currents cause pixelization and frame freeze of the IPTV service at the subscriber's premise 36.

To avoid interruption or pixelization, which can occur for example, when the local ham radio operator decides to key his transmitter or when the power system load changes, cable manufacturers spend considerable effort to keep tip and ring resistances and capacitances equal (balanced) in order to maximize the amount of longitudinal current/voltage cancelled. Pair balance cannot however, be depended upon to reduce the metallic voltage on a pair by more than 60 dB below longitudinal voltage in the POTS, ADSL or VDSL bands. Therefore, in addition to achieving good balance, the longitudinal voltages coupling onto the pairs must be minimized by providing good shield bonding. By providing good shield bonding for cables carrying IPTV service, longitudinal voltages, which are measured as noise-to-ground, will be minimized thereby reducing the occurrence of pixelization and frame freeze, for example. In order to deploy IPTV over existing distribution cables, therefore, carriers must clean up all the shield bonding from the cross-connect box 30 to the subscriber's premise 36. To deliver IPTV to the premise 36 the process must focus on the noise performance of distribution cables 22 between the cross-connect box 30 and the furthest IPTV subscriber's premise 36 along the distribution cable 22 in question. In some instances, attention must also be given to bad bonding in the distribution cable 22 beyond the furthest IPTV subscriber's premise 36, i.e. a portion of the distribution cable beyond the last IPTV subscriber's premise 36 which carries only POTS service, as high noise-to-ground can back-feed longitudinal voltage on other pairs, and cause trouble in the IPTV sections. In addition, noise is coupled from the F1 feeder cables 20, to the F2 distribution cables 22 by jumpers 32 in the cross-connect box 30. In locations with excessive power influence (PI) or noise-to-ground (Ng) in the feeder cables 20, the feeder cable shield bonding will also need to be repaired before IPTV can be provided on the cable. Thus, there is a need for a simplified method of locating open cable shields that can be easily understood by a broadband technician.

As mentioned above, ADSL and VDSL technology is used to modulate and carry the digital IPTV signals. FIG. 1 illustrates the connections utilized for VDSL and ADSL technology. With VDSL technology, pairs with POTS signal come from the central office 23 through feed cable 20 to the cross-connect box 30, where a first jumper connects through the interconnect 32 to the DSLAM 28. There the pair is looped through modem 50, and is returned by a second jumper through the interconnect cable 32 back to the cross-connect 30, then into the distribution cable 22 where it travels to the subscriber 36.

It is to be understood that the same concepts apply with respect to ADSL technology. In particular it is noted in FIG. 1 that with ADSL technology, the ADSL DSLAM 25 is provided at the central office 23 and the DLSAM in the fiber node 26 is not utilized. Pairs with POTS signals and ADSL signals superimposed come from the central office 23 through feeder cable 21 to the cross-connect box 30, where a single jumper connects each pair directly to the distribution cable 22 where it travels to the subscriber 36.

A method currently used to locate open shield sections utilizes modem sync rate readings. This method is not, however, accurate. The broad band technician cannot accurately locate the open shield section by taking xDSL modem sync rate readings at access points along the cable because as the technician approaches the DRAM, the pair loss decreases and the signal is stronger. An acceptable sync rate at an access point, therefore, does not mean the bad bonding is behind you, it just means the pair has an acceptable signal-to-noise ratio at that location. The source of the noise from the bad shielding can be either before or after this location. Because, this modem sync rate method can not be used to accurately predict the location of the open shield, there is a need for a method for isolating an open shield section that is more accurate.

Another disadvantage of the modem sync rate method is that the technician must open the pair to take a sync rate reading at an access point along the cable. When the pair is opened, the technician disrupts the induced longitudinal current flow on the pair under test, changing the noise level metallic on the pair and the sync rate. Thus there is a need for a shield bonding isolation method that does not require the pair to be opened at each access point.

Measuring noise metallic (Nm, i.e., the noise between the two conductors, of the pair) can also provide an inaccurate indication of noise-to-ground (Ng, i.e. the noise from conductors to ground) which can be misleading. For example, if the technician happens to pick a pair with above average balance, the test may indicate an acceptable noise metallic (Nm) level when in fact, the noise-to-ground (Ng) level is unacceptable. Therefore, other pairs in the cable with an average balance and which provide excessive noise-to-ground levels will go undetected unless that particular pair is measured. Thus, there is a need for a shield bonding isolation method that does not depend on pair balance.

Often the cable is spliced at points along the run. Many of these splices are direct buried, and it is very costly to open them unless they are truly in trouble. The broadband technician will need a way to isolate the general areas of noise intrusion due to poorly bonded shield sections to focus shield testing and repair efforts to a limited number of splices or terminals in these areas.

The present invention provides an apparatus and method for testing the integrity of the cable shield and if necessary isolating the shield trouble. The apparatus and methods of the present invention overcomes the problems presented in the prior art and provide additional advantages over the prior art, such advantages will become clear upon a reading of the attached specification in combination with a study of the drawings.

SUMMARY OF THE INVENTION

Briefly, the present invention discloses an apparatus and method for testing the integrity of a cable shield at access points along the cable and for locating a shield problem. If a shield problem is detected, the shield integrity test provides a No-Go/Fail indication. If a No-Go/Fail indication is provided as a result of the cable shield integrity test, the shield trouble isolation method of the present invention is used to locate the shield problem. This method utilizes data presented either in a table or graphically to allow the technician to determine the predicted location of the shield trouble.

BRIEF DESCRIPTION OF THE DRAWINGS

The organization and manner of the structure and operation of the invention, together with further objects and advantages thereof, may best be understood by reference to the following description, taken in connection with the accompanying drawings, wherein like reference numerals identify like elements in which.

DETAILED DESCRIPTION OF THE ILLUSTRATED EMBODIMENT

Figure 1:
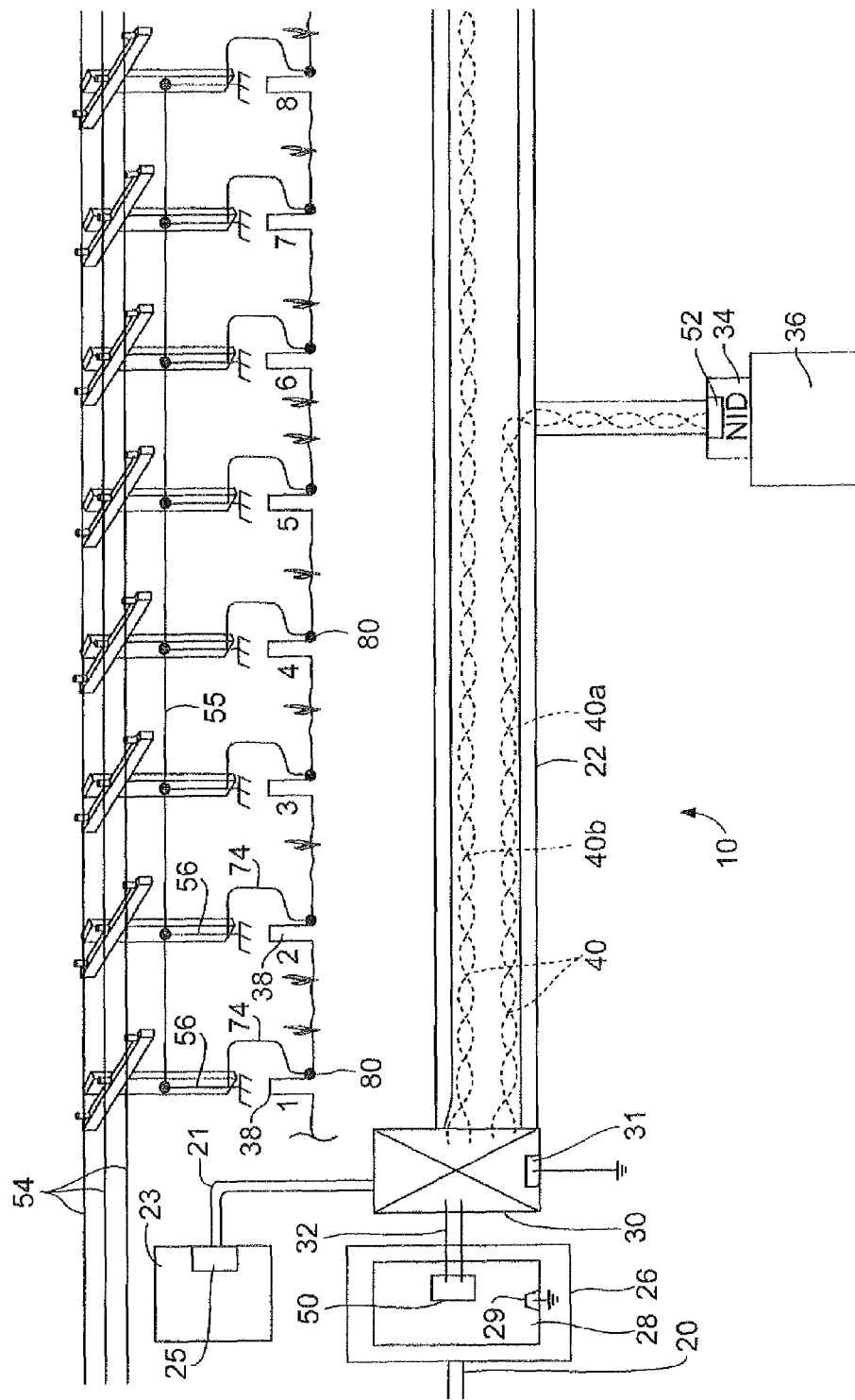
FIG. 1 illustrates portions of a telecommunications system.
Figure 2:
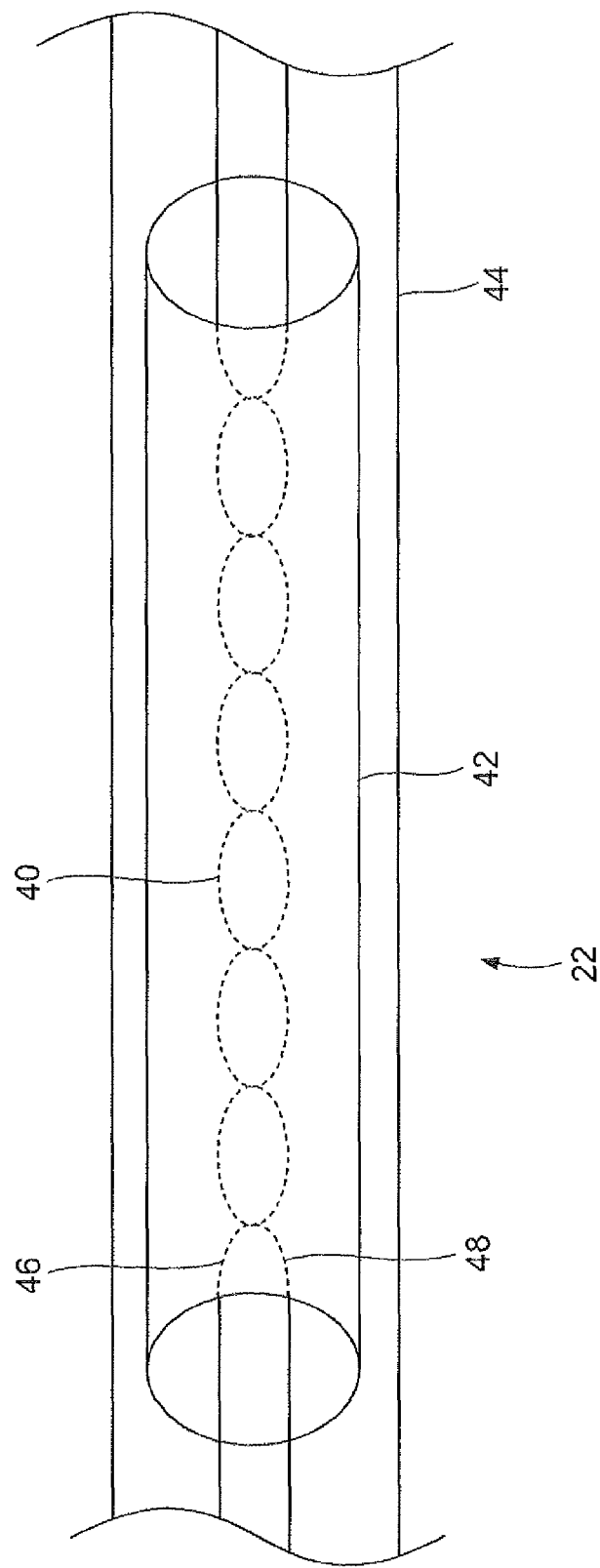
FIG. 2 illustrates a portion of a distribution cable.
Figure 3:
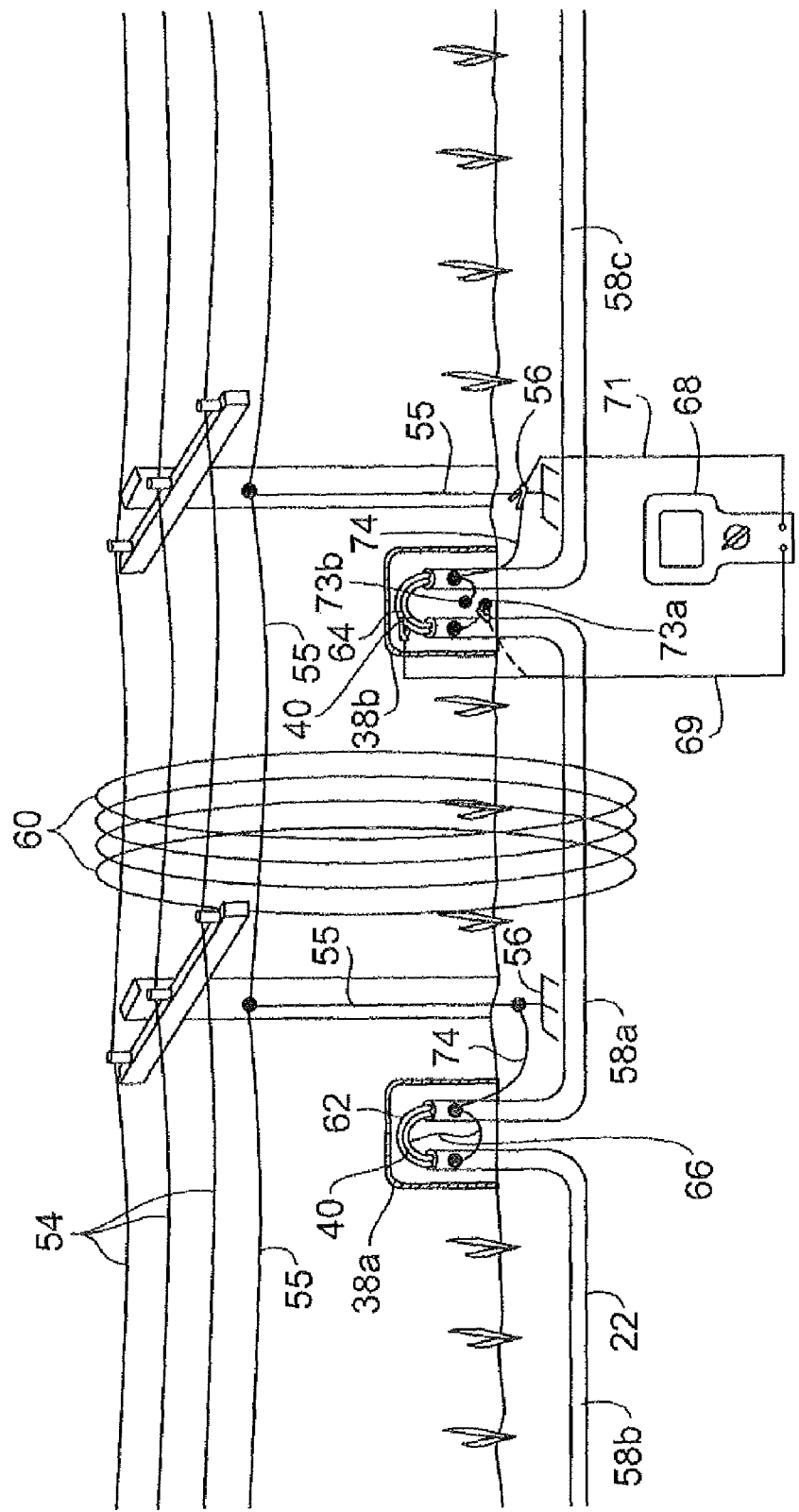
FIG. 3 illustrates a portion of the telecommunications system of FIG. 1 and the influence of power lines on the telecommunication cable.
Figure 4:
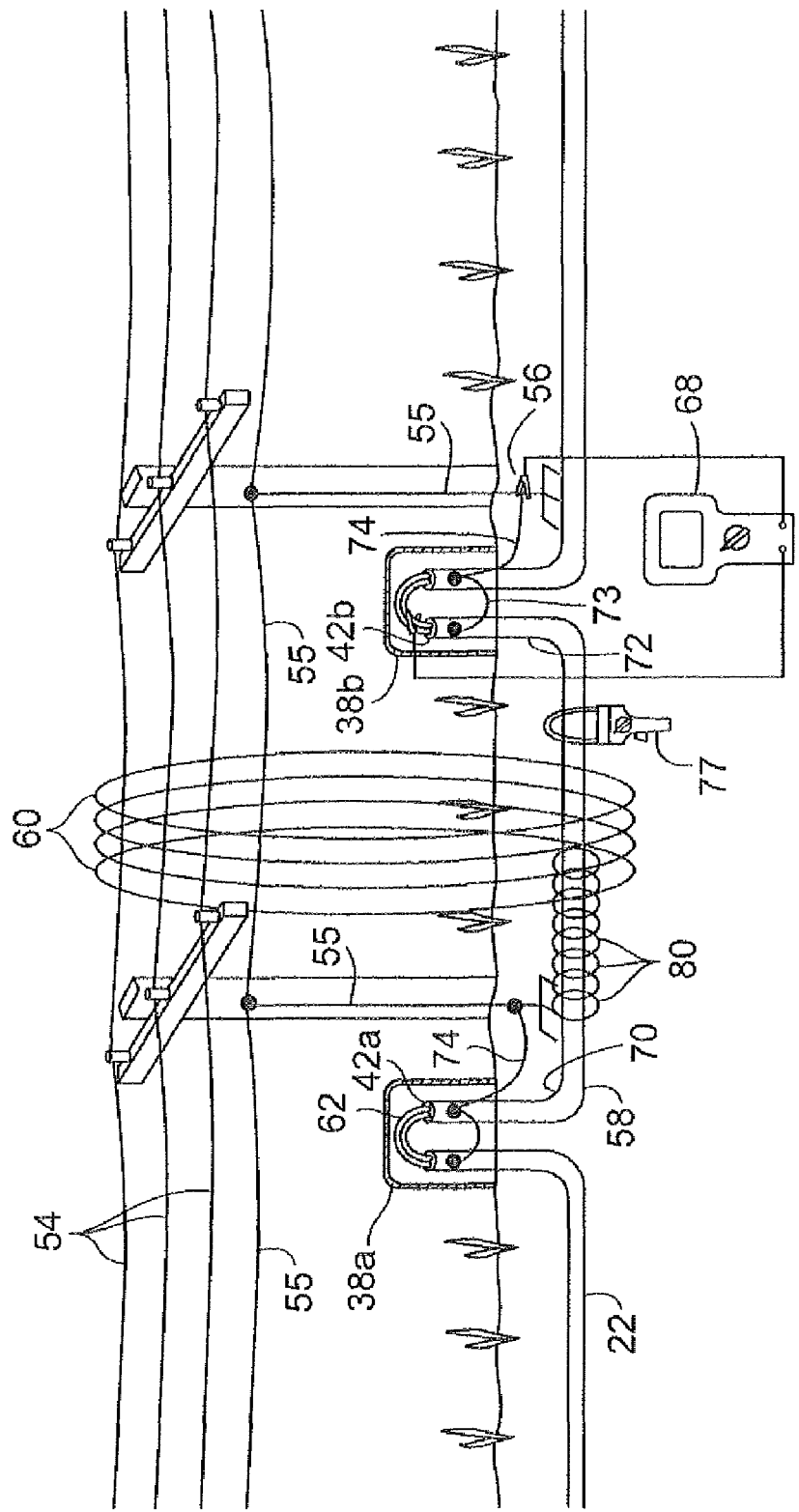
FIG. 4 illustrates a cable shield bonded to power neutral and an induced shield current which cancels the induced voltages on the pairs.

While the invention may be susceptible to embodiment in different forms, there is shown in the drawings, and herein will be described in detail, a specific embodiment with the understanding that the present disclosure is to be considered an exemplification of the principles of the invention, and is not intended to limit the invention to that as illustrated and described herein.

As noted above, when IPTV is deployed over telephone twisted pairs 40, shield bonding and grounding must be intact to prevent TV pixilation, frame freeze or other issues due to impulse noise. First, a cable shield integrity test will determine whether poor bonding or an open shield exists. If a bad bond or open shield exists, a shield trouble isolation method is then performed. This shield trouble isolation method presents data gathered at a variety of access points to allow the broadband technician to identify a predicted location of the shield trouble. Finally, once the technician has isolated the cable sections with poor bonding or an open shield, the technician will use an open shield locator to pinpoint the location of the open shield.

In performing the shield integrity test and the shield trouble isolation method of the present invention, each method requires noise-to-ground measurements. Although noise-to-ground (Ng) or power influence (PI) measurements have been used on voice lines for years to isolate cable sections with bad bonding, these measurements are taken using a C-message (voiceband) filter. When a C-message filter is used, noise in the range of xDSL signals are filtered from the measurement and therefore the technician will not be able to observe all the bonding problems that affect xDSL services. Thus, to troubleshoot shield bonding problems in xDSL circuits, the technician should not use the C-Message Filter. Although these noise-to-ground measurements taken utilizing a C-Message filter will work on some occasions, frequently they will lead the technician astray due to the fact that the C-message filter only provides a measurement of noise in the voiceband (i.e. around 1 kHz), and the interferers interrupting xDSL signals are frequently in the Megahertz range, i.e. over 1000 times higher in frequency.

In the present invention, frequencies in the xDSL band are utilized and wideband noise-to-ground measurements are used to isolate shield bonding problems that affect xDSL services. For ADSL the technician should use a G filter to make noise readings in the middle of the ADSL band, focusing on frequencies up to 1 MHz that are likely interfering. For VDSL the technician should use a V Filter that measures noise up to 30 MHz. It should be noted that the apparatus and methods of the current invention do not preclude the technician from selecting a C message filter to do helpful profiling to isolate voiceband noise and power influence problems. However cable shielding is far more effective at higher frequencies and it is usually more effective to use wideband analysis even when troubleshooting voiceband noise problems.

The term wideband noise-to-ground as used generically herein indicates noise measured with any chosen wideband filter as opposed to a voiceband filter, and is indicated by NgW. If a band filter is used, such as, for example, a G filter for ADSL, the term noise-to-ground G filter (NgG) is used. For ADSL, a G filter is used to look at noise-to-ground from 20 kHz to 1.1 MHz (NgG). For VDSL, a V filter is used to look at noise-to-ground from 20 kHz to 30 MHz (NgV).

Cable Shield Integrity Test

Figure 6:
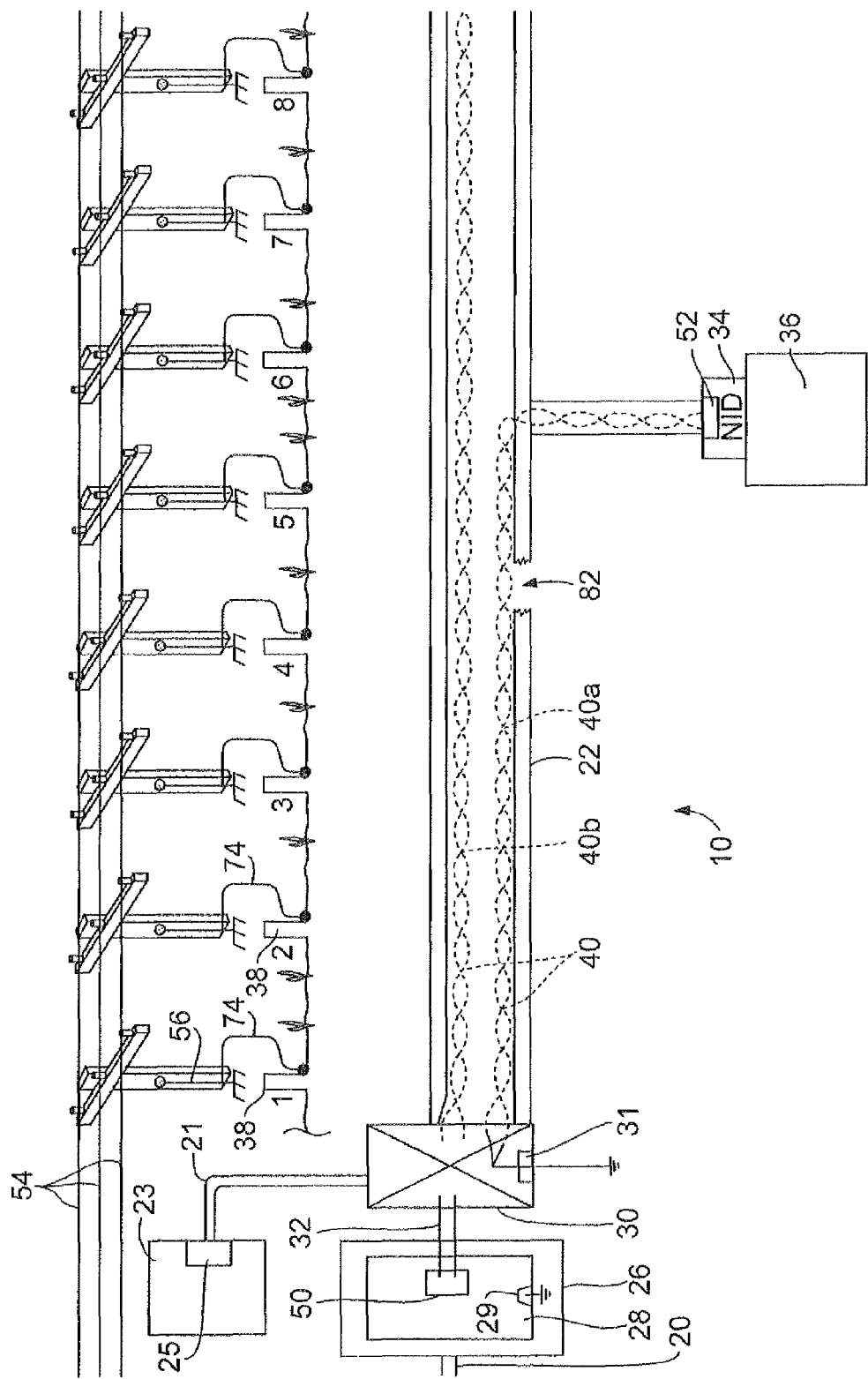
FIG. 6 illustrates portions of a telecommunication system with a reference pair shorted and grounded in accordance with the method of the present invention.

The technician will determine whether there is a poor bond on the cable shield 42 or an open 82 in the cable shield 42 by performing a cable shield integrity test. The cable shield integrity test can be used in connection with VDSL service or ADSL service. FIG. 6 represents a fiber-to-the node deployment of IPTV over VDSL or ADSL. In the case of ADSL, the DSLAM 25 in the central office 23 is utilized. In the case of VDSL, the DSLAM 28 in the fiber fed node 26 is utilized. Except as described herein performance of the cable shield integrity test is the same for both VDSL and ADSL service.

FIG. 6 illustrates use of the telecommunications system 10 shown in FIG. 1, configured for the purpose of conducting the shield integrity test and the shield trouble isolation test (described below) to detect and locate the open 82 in the cable shield 42. The distribution cable 22 includes a plurality of pairs 40 (two of which are shown). A plurality of pairs 40 extend from the cross-connect box 30 to the NIDs 34 of subscribers premises. One such pair 40a extending to the last subscriber's premise 36 is illustrated in FIG. 6. Other pairs extend from the cross-connect box 30 beyond the last subscriber's premise 36. One such pair 40b is illustrated in FIG. 6. To perform the cable shield integrity test, the technician may use the subscriber's pair 40a as the subscriber's pair 40a will likely be easily identifiable. This cable shield integrity test can, however, be performed at any access point 38 or at any subscriber's premise 36. The cable shield integrity test is most definitive when taken at the last broadband subscriber on the distribution cable 22. Or, more preferably, if taken at the last access point 38 on the distribution cable 22 as bad bonding beyond the last broadband subscriber 36 can feed back on the other cable pairs 40 to disrupt broadband even though broadband pairs 40b are cut-off beyond the last subscriber's premise 36.

In FIG. 6, the technician has chosen pair 40a as the reference pair for the cable shield integrity test. Reference pair 40a of the distribution cable 22 extends from the cross-connect box 30 to the network interface device (NID) 34 located at the subscriber's premise 36. At the cross-connect box 30, the ring and tip 46, 48 of the pair 40a are shorted and grounded to a ground bar 31. With the reference pair 40a shorted and grounded at the cross-connect box 30, this test will predict the signal-to-noise ratio even before the DSLAM 28 is placed into service.

Figure 7:
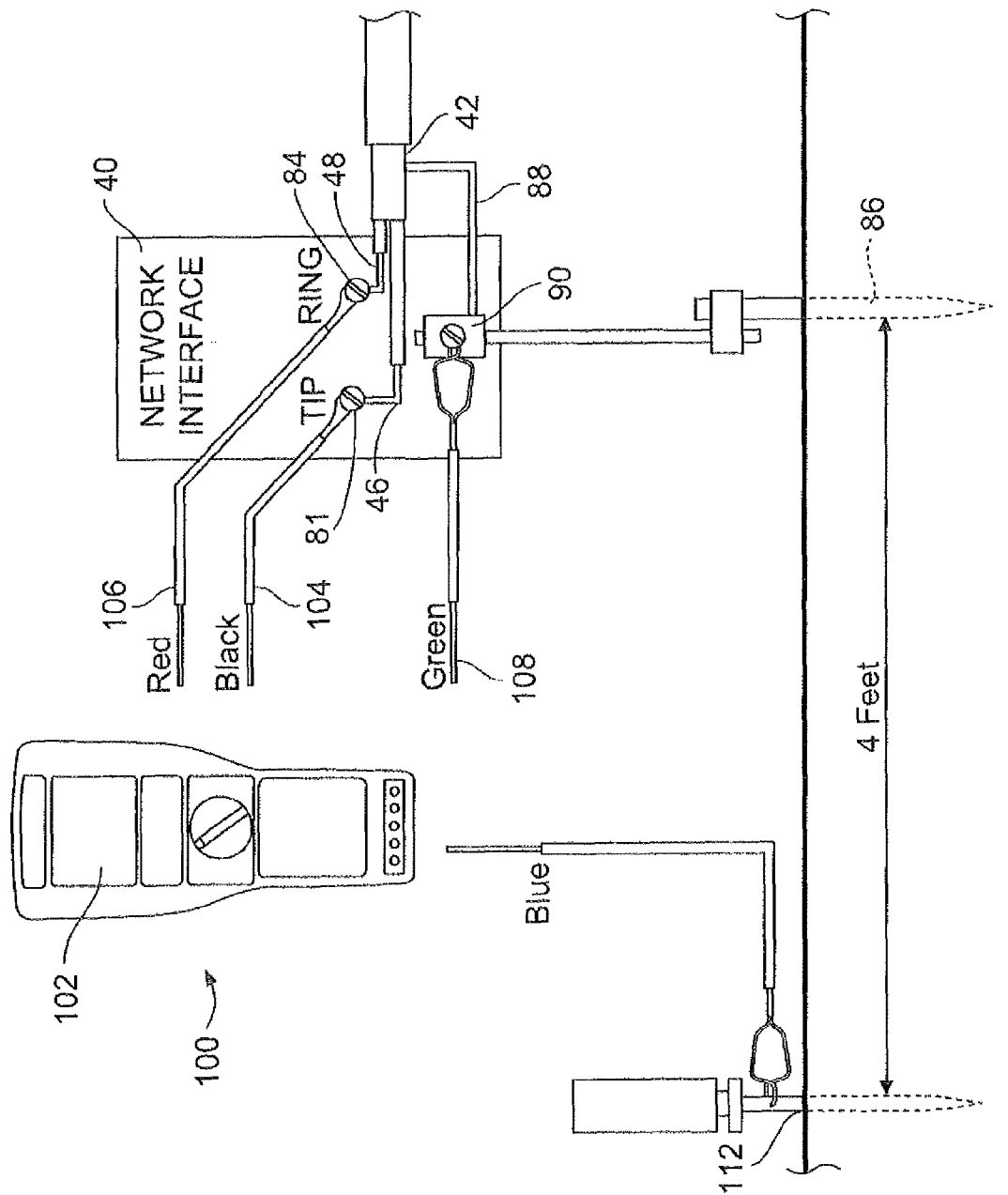
FIG. 7 illustrates connection of a test set at the network interface device in accordance with the method of the present invention.

Connection of the tip/first conductor 46 and ring/second conductor 48 of the pair 40a at the NID 34 is illustrated in FIG. 7. The tip 46 is secured to a tip connector 81 and the ring 48 is secured to a ring connector 84. The cable shield 42 of the distribution cable 22 is connected to a local ground rod 86 through a shield ground connection 88 and a ground rod connector 90.

Connection of the test set 100 used to perform the shield integrity test is also illustrated in FIG. 7. The test set 100 includes a plurality of external leads which have been colored for ease of identification. The BLACK lead 104 is connected to tip connector 81 using an alligator type clip for example, the RED lead 106 is connected to the ring connection 84 using an alligator type clip for example, the GREEN lead 108 is connected to the ground rod connector 90, and the BLUE lead 110 is connected to a ground stake 112 or temporary earth ground (sometimes referred to as a "screwdriver ground"). The ground stake 112 is preferably placed approximately 4 feet or more from the local ground rod 86 of the NID 34. The BLUE lead 112 provides a high impedance input for the test instrument 100 so as not to load down ambient voltages on the pair 40a.

The test set 100 includes a memory and a processor and is programmed to perform a variety of functions. A user interface including the display 102 provides for interactive communication between the technician and the test set 100.

The test set 100 is configured to store data regarding a variety of models of DSL modems 50. More specifically, the test set 100 includes data regarding the anticipated modem output power for each model DSL modem 50 included in the memory. The anticipated modem output power for each model DSL modem 50 is selected from the modem vendor's specifications based upon the assumption that the maximum interference is provided, inducing that modem to program itself to send signals having a maximum power.

Utilizing the user interface, the test set technician identifies the model of the DSL modem 50 thereby selecting the anticipated modem output power assuming maximum interference. Alternatively, rather than specifying the particular model of DSL modem 50, the test set can be configured to allow for a more general selection of the type of modem to be used. For example, the test set 100 may be configured to prompt the user to simply identify the modem 50 as a VDSL type or an ADSL type. In another example, the user may be prompted to select the modem 50 as an ADSL, ADSL2, ADSL2+, VDSL, VDSL2, or VDSL2+ type.

With the test set 100 appropriately connected, the technician utilizes the test set 100 to measure the loop resistance (Measured Loop Resistance/Pair Loop Ohms) of the reference pair 40a. The test set 100 calculates the expected pair loss of the reference pair 40a (Expected Pair Loss) based upon the measured loop resistance of the reference pair.

The test set 100 is configured to calculate the predicted power level of the signal received by the subscriber (Predicted Signal Level Power) based upon the anticipated modem output power and the calculated Expected Pair Loss. Preferably the test set 100 is configured to subtract the calculated Expected Pair Loss, in dB, from the selected anticipated modem output power, in dBm, to obtain the Predicted Signal Level Power in dBm.

The test set 100 is configured to measure wideband noise-to-ground (Wideband Noise-To-Ground, NgW) on the reference pair 40a. The term wideband herein includes all available bandwidth filters including F, G, and V and others. Preferably wide band noise to ground (NgW) on the reference pair 40a is measured and displayed in dBrn (dBm+90) or dBm for example. As mentioned above, when measuring noise-to-ground, the technician should not use a C message filter because a C message filter looks only at the voice band and therefore may not see the source of xDSL interference. If the remote modem 52 is an ADSL type modem, when measuring noise to ground, the technician can use a G filter to focus on frequencies up to 1 MHz that are likely interfering. If the remote modem 52 is a VDSL type modem, when measuring noise-to-ground the technician can use a filter to focus on frequencies up to 30 MHz. Such a filter focusing on frequencies up to 30 MHz can be referred to as a V filter. If a filter is utilized in making the noise-to-ground measurement, the test instrument 100 is configured to provide an indication of the type of filter utilized on the display. For example, if a G type filter is utilized, the noise-to-ground measurement is designated as dBrnG. Preferably, the test set 100 is configured to automatically select the appropriate filter to be utilized for the noise-to-ground measurement based upon the type of the remote modem 52 identified by the technician.

After measuring the Wideband Noise-To-Ground, the test set 100 is configured to calculate the Predicted Noise Metallic based upon the measured Wideband Noise-To-Ground and a Minimum Expected Pair Balance. Preferably the test set 100 is configured to subtract the Minimum Expected Pair Balance from the Wideband Noise-To-Ground measurement to obtain a Predicted Noise Metallic value. The test set 100 can be configured to prompt the technician to enter a Minimum. Expected Pair Balance or the test set 100 can be configured to use a predetermined. Minimum Expected Pair Balance, such as for example, 50 dB. The Predicted Noise Metallic is provided in dBm or dBrn at the chosen filter bandwidth.

The test set 100 is configured to compute the Predicted Signal-To-Noise Ratio based upon the Predicted Signal Level Power and the Predicted Noise Metallic. Preferably the Predicted-Signal-To-Noise Ratio is calculated by subtracting the Predicted Noise Metallic in dBm from the Predicted Signal Level Power in dBm. The calculation of the Predicted Signal-To-Noise Ratio can be provided and displayed in dB.

Finally, upon calculating the Predicted Signal-To-Noise Ratio, the test set 100 compares the Predicted Signal-To-Noise Ratio with a predetermined threshold. If the Predicted Signal-To-Noise Ratio is greater than the predetermined threshold, the test instrument will provide a "GO"/"PASS" indication, i.e. an indication that the shield bonding is sufficient. If the Predicted Signal-To-Noise Ratio is less than the predetermined threshold, the test instrument displays a "No Go"/"Fail" indication, i.e. an indication that there is a shield bonding problem. The predetermined threshold can be, for example, 10 dB. When the shield integrity test is performed on the system shown in FIG. 6, for example, a "No Go"/"Fail" indication will be provided due to the open 82 in the cable shield 42.

If appropriate, further refinement of the Predicted Signal-To-Noise Ratio can be made. For example, the test set 100 can be configured to account for the gauge of the conductors 46, 48 when calculating the Expected Pair Loss. To do so, the test set 100 can be configured to prompt the user to enter the gauge of the conductors 46, 48 and the test set 100 is configured to calculate the Expected Pair Loss for the selected xDSL band (Calculated Pair Loss) utilizing the Measured Loop Resistance and the gauge of the wire selected. Alternatively, rather than allowing the user to enter the gauge of the conductors of the cable, the Expected Pair Loss can be calculated based upon an average gauge utilized. In this situation the technician is not required to enter or select the gauge of the conductor.

Thus, the reference pair 40a is used for making a Wideband Noise-To-Ground measurement. If the Predicted Signal-To-Noise Ratio is within an acceptable range, the test instrument 100 is programmed to provide the technician with a "GO"/"Pass" indication. If the Predicted Signal-To-Noise ratio is not acceptable, the test instrument 100 is programmed to provide the technician with a "No-Go"/"Fail" indication which indicates to the technician that the shield 42 of the distribution cable 22 is not acceptable, i.e. that trouble with the shield 42 exists. Upon receiving the "No-Go"/"Fail" indication from the shield integrity test, the technician will further utilize the test instrument 100 to perform the shield trouble isolation method in order to isolate the shield trouble to a particular section of the cable 22, i.e. to determine the location of the shield trouble.

When ADSL services is at issue, shield bonding is tested and isolated in distribution cable 22 by first shorting and grounding a reference pair at the cross-connect box 30 just as with VDSL. If these tests indicate there is shield trouble in the feeder cable 21, a test pair would then be shorted and grounded at the central office mainframe and the isolation process would be performed on the feeder cable 21 is a similar fashion as with the distribution cable 22.

Shield Trouble Isolation Method

Upon indication of No Go/Fail as a result of the shield integrity test, the technician employs the shield trouble isolation method to isolate the location of the shield trouble. The present invention allows the broadband technician to take measurements at several access points/access locations 38. Analysis of the data obtained from the measurements will lead the technician directly to the open shield cable sections or poorly bonded cable shield sections, eliminating the need to open multiple splices for testing. More specifically, the shield trouble isolation method utilizes noise-to-ground measurements (sometimes referred to as power influence PI) to isolate the section of the cable with open shield or poor bonding as will be described herein.

Before wideband noise-to-ground measurements are taken, the test instrument is prepared for taking such measurements by selecting the appropriate filter to be used. As noted above a V-filter can be used for VDSL service and a G filter can be used for ADSL service.

The telecommunication system for which the shield trouble isolation method will be performed is shown in FIG. 6. To perform the test, a pair of conductors 40 is selected by the technician to be used as a reference pair. Preferably, the technician will identify a good pair (i.e. one which has balanced capacitance and no observable resistance faults) that runs the full length of the cable 22 under test. The technician may, for example, use the subscriber's pair 40a as the reference pair. If the technician believes the open shield could be located beyond the subscriber terminal 36, a pair such as the pair 40b that extends to the end of the cable 22 should be selected for performing the shield trouble isolation method. If the shied trouble isolation test is being performed after performance of the shield integrity test, the same pair 40 used a reference pair for the shield integrity test may be used as a reference pair for the shield trouble isolation method.

Selection of the pair 40a as the reference pair is illustrated in FIG. 6. Upon selection of a pair 40a, the technician shorts the tip 46 and the ring 48 of the pair 40a and grounds the reference pair 40a at the cross-connect ground 31. It is noted that a working pair (i.e. one which is not shorted and grounded at the cross connect) or a floating pair, should not be selected for the shield trouble isolation method. Nearby power lines 54 induce noise-to-ground into the F1 feeder cables 20. This noise-to-ground is coupled through the cross connect jumpers 32 and by capacitance coupling it appears on all pairs in the F2 distribution cable 22. If a working or floating pair is used, the technician will not be able to determine whether the noise is coming from the F1 feeder cable 20 or the F2 distribution cable 22. By shorting and grounding the referenced pair 40a at the cross connect any capacitance coupled longitudinal voltages coming in from the F1 feeder cable 21 through the cross connect jumpers 32 are grounded out to create a low noise-to-ground starting point at the cross-connect box 30. The noise-to-ground reading will be essentially zero as the cross-connect box 30 and provides a baseline on the dB graph and a reference for other dB readings as will be described herein The low noise-to-ground reference at the cross-connect box therefore simplifies analysis of the graphs produced as will be described herein.

Figure 5:
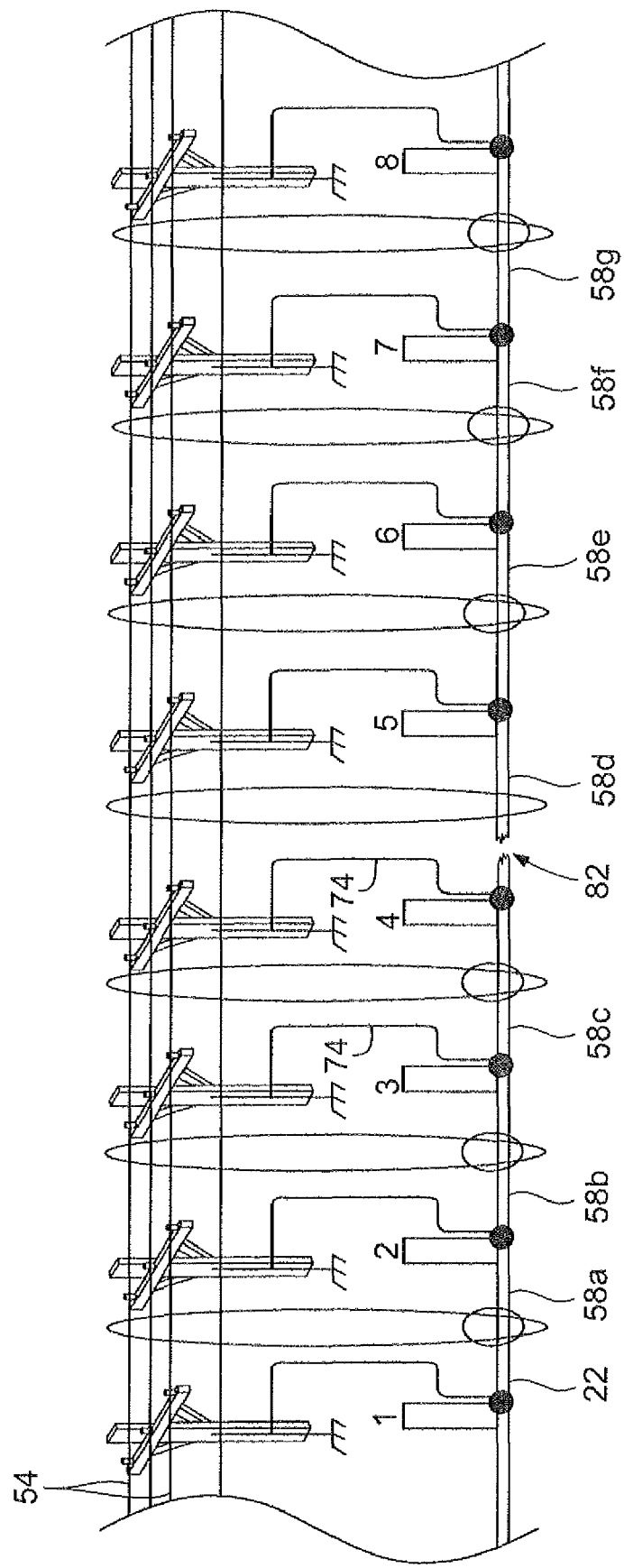
FIG. 5 illustrates bonding of a cable shield to power neutral at multiple access points wherein one shield section of the cable includes an open.

With the reference pair 40a shorted and ground, the technician next connects the test instrument 100 at an access point 38 for the purpose of taking Wideband Noise-To-Ground measurements. As illustrated in FIGS. 5 and 6, for example, several access points 38 are provided along the length of the distribution cable 22, Connection of the test set 100 at an access point 38 for taking wideband noise-to-ground measurement in the shield trouble isolation method is identical to connection of the test set 100 at the access points 38 for taking wideband noise-to-ground measurement in the shield integrity test.

Figure 8:
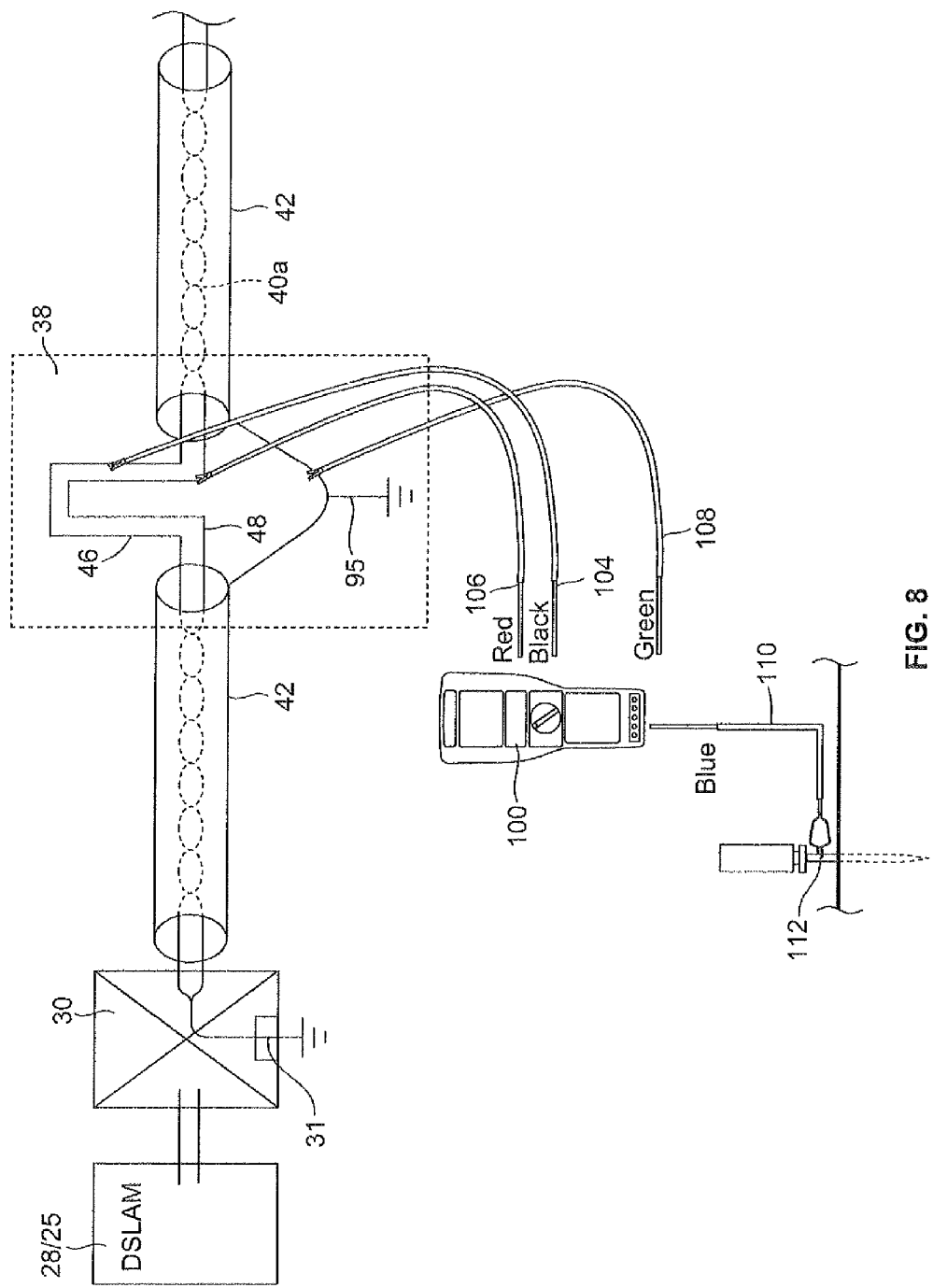
FIG. 8 illustrates connection of a test set to a reference pair at an access point of the telecommunications cable in accordance with the method of the present invention.

As shown in FIG. 8, the test set 100 is connected as follows: the BLACK and RED leads 104, 106 of the test set 100 are bridged onto the reference pair 40a preferably using bed of nail type clips. The access point 38 provides access to the reference pair 40a and by using bed of nail type clips to pierce the insulation which covers the tip 46 and the ring 48, it is not necessary to open the pair for the purpose of conducting the test, i.e. the reference pair 40a should not be cut in order to make connection of the test instrument leads 104, 106 to the tip and ring 46, 48. Connection of the cable shield 42 is provided to a local ground rod 95 and the GREEN lead 108 is connected to the local ground rod 95. The BLUE lead 110 is connected to a temporary earth ground rod/screwdriver ground 112.

Use of the temporary earth ground rod 112 as described above, prevents noise sometimes present on the shield 42 from corrupting the Wideband Noise-To-Ground readings (NgW). In a second mode of operation the Wideband Noise-To-Ground measurements (NgW) can be made without connecting the BLUE lead 110 to the temporary earth ground 112. In this second mode, the Wideband Noise-To-Ground measurement accuracy may be reduced by the presence of noise on the local ground connection 108, but the Wideband Noise-To-Ground measurements are sufficiently adequate for locating most open shield problems. In this second mode, the test set 100 utilizes the GREEN lead 108 as reference for the Wideband Noise-To-Ground (NgW) measurements. When the GREEN lead 108 is utilized as a reference for the Wideband Noise-To-Ground measurements, measurements can be taken in areas where access to earth ground is difficult or not available, for example, in paved areas. The test set 100 can be programmed to automatically detect whether the BLUE lead 110 is connected, or to have the technician select the BLUE or GREEN lead as reference for the wideband noise-to-ground measurements (NgW).

Once the access point 38 for connection has been selected and connection of the test instrument 100 has been made, the technician can initiate the following measurements and calculations to be performed by the test instrument 100.

1. Loop Resistance. The test set 100 is configured to measure the Loop Resistance of the reference pair 40a back to cross-connect box 30 (i.e. the reference pair loop ohms).

2. Distance Out. The test set 100 is configured to compute the distance from the cross-connect box 30 to the access point 38 at which the test instrument 100 is connected. The Distance Out is calculated based upon the Loop Resistance of the reference pair 40a and the gauge of that pair 40a previously entered by the technician. Alternatively, the calculation of Distance Out does not need to be based upon the gauge of the reference pair 40a but rather can simply be based upon the Loop Resistance.

3. Wideband Noise-to-Ground. The test set 100 provides a high impedance termination and is configured to measure Wideband Noise-To-Ground from the pair to the temporary ground 112. With the high impedance termination the test set 100 does not load the circuit down and therefore avoids reducing the Wideband Noise-To-Ground (NgW) below the level that existed before connection of the test set 100 at the access point 38.

4. Shield Resistance. Shield resistance data from cable manufacturers is stored in the memory of the test set 100. The test set 100 is configured to prompt the technician to enter the circumference or diameter of the cable 22. Utilizing the user interface and the display 102, the technician enters the circumference or diameter of the cable being tested and based upon the data from the cable manufacturer and the circumference or diameter of the cable, the test set 100 is configured to interpolate the shield resistance of the cable to the cross-connect.

5. Local Ground Resistance. The test set 100 is configured to measure the ground resistance at the access point 38. The local ground resistance is a parallel combination of the shield resistance to the cross-connect box 30, the shield resistance of the distribution cable 22 to the access point 38, and any parallel ground resistance. This local ground resistance is measured by sourcing a measured current (impressed current) into the local ground from one side of the reference pair, i.e. a measured current is sourced into the local ground 95 from the RED lead 106 which is connected to the ring 48 of the reference pair, the other end of which is grounded at the cross-connect box 30. Next, the BLACK lead 104 is used to sense voltage on the far end of the shield 42 (i.e. to sense voltage on the known good ground at the cross-connect box 30.). The voltage drop between the BLACK lead (connecting via the tip wire 46 to the ground at the cross-connect box 30) and the GREEN lead is measured representing the voltage fall across the local ground resistance. The local ground resistance is then computed by dividing the (local ground voltage fall) by the (impressed current). The BLUE lead is not necessary for this measurement.

The test set 100 is configured to display each of the above measurement and calculations taken at each access points as the technician moves out along the cable. When the technician selects a record function on the test set 100, the test set 100 will automatically record the following data into a table: Loop Resistance/Loop Ohms of the reference pair 40a; computed Distance Out to the access point 38; Wideband Noise-To-Ground measured (NgW) at the access point 38; Local Ground Resistance measure at the access point 38; and Shield Resistance computed at the access point 38. A table such as that shown below is provided. Each row of values relates to an access point 38, at which the test set 100 is connected and measurements have been made. Values for each of the variables listed are entered into the table.

| Reference Pair Loop Ohms | Computed Distance Out | Wideband Noise-to-ground (NgW) | Measured Local Ground Resistance | Computed Shield Resistance |
| --- | --- | --- | --- | --- |

As the Wideband Noise-To-Ground measurements are taken, the technician observes the NgW readings on screen to verify the reading is valid. For example, if the leads are connected incorrectly, the technician will observe a reading indicating there is no noise/a very high amount of noise or the reading will indicate that there is no calculated distance/very high calculated distance. If the reading is valid the technician will save the reading.

After measurements are taken at a first access point 38, the technician moves to a new access point 38 along the distribution cable 22 and takes the measurements at the new access point 38. Data derived from the above described measurements and calculations are transferred to the memory and displayed in the table shown above.

The technician may, for example, begin by taking a measurement at an access point 38 close to the cross-connect box 30 and take subsequent measurements as the technician moves out along the reference pair 40a of the distribution cable 22 in a direction away from the cross-connect box 30. In this scenario, the Wideband Noise-To-Ground (NgW) measurements will start out very low at the access point close to the cross-connect box 30 and will rise as the technician moves into the field, passing magnetic induction fields along the way. The loop resistance of the reference pair 40a will increase as the technician moves away from the cross-connect box 30 and is used to compute an accurate distance between the cross-connect box 30 and the access point 38 at which the measurements are taken. This calculated distance is then used for plotting wideband noise-to-ground (NgW) versus distance on the graph.

In the above described scenario, the technician takes a series of measurements with the test set 100 by starting at the cross-connect box 30 and then moving out along the reference pair 40a of the distribution cable 22. It is to be understood, however, that the technician is not required to take measurements in any particular order. Rather, as measurements are taken and recorded, the test set 100 will automatically place the measurements in the table sequentially using the computed distance out. The measurement and calculations can be displayed in order in accordance with an ascending distance out or in accordance with a descending distance out.

Although the method described above includes measuring the local ground resistance and computing a shield resistance at each access point where measurements are taken, it is to be understood that the measured local ground resistance and the computed shield resistance are not necessary for determining the location of the shield trouble. The measurement of local ground resistance and the calculated shield resistance can, however, be used by the technician to confirm the location of the shield problem as will be discussed herein.

FIGS. 5 and 6 illustrate an example of a distribution cable 22 upon which the shield trouble isolation method of the present invention can be employed. As shown, a series of access points 38 are provided along the distribution cable 22. Power lines 54 are positioned proximate the distribution cable 22. An open 82 is provided in the cable shield 42 between fourth and fifth access points 38. Due to the open 82, no shield current is provided on the section of the cable 22 which extends between the fourth and fifth access points 38 and therefore the current induced by the power lines 54 is not cancelled in the section of cable extending between the fourth and fifth access points 38.

As noted above the test set 100 measures the wideband noise-to-ground (NgW). Wideband noise-to-ground (NgW) is a measurement of the common mode noise on the pair 40a (RED and BLACK leads 104, 106) versus an earth ground 112 (BLUE lead 110). If the shield bonding is good, the wideband noise-to-ground (NgW) on the reference pair 40a should gradually rise to an acceptably low value at the subscriber 36. If, however, the shield is open and exposure to induction fields is provided, the wideband noise-to-ground (NgW) value will increase dramatically in those sections of cable with an open shield 82, giving an unacceptably high noise at the subscriber. As discussed above, an open shield 82 has no shield current to cancel the induction. Thus, through the poorly bonded section, the values of wideband noise-to-ground (NgW) will rapidly rise. By arranging the noise-to-ground measurements in the table based upon an ascending or descending distance out calculation, the technician will be able to readily identify the rapid rise in the noise-to-ground measurements, thereby identifying the location of the poor bond/open 82.

Although the table described above can provide the technician with the location of the poor shield bonds, the location of the bad bond/open 82 can also be identified by graphically displaying the wideband noise-to-ground (NgW) measurements. The test set 100 is configured to automatically graph wideband noise-to-ground (NgW) versus distance. Thus, as the technician records readings at each access point, a graph develops on the display of the test set 100. If the shield bonding is good, the NgW voltage on the reference pair 40a gradually rises to an acceptably low value at the subscriber. If, however, the shield 42 is open and exposure to induction fields is provided, the wideband noise-to-ground (NgW) will ramp steeply up in those sections of cable with open shield, giving an unacceptably high reading at the subscriber. As discussed above, an open shield has no shield current to cancel the induction. The graph will clearly show the rapidly rising wideband noise-to-ground (NgW) through the poorly bonded section.

Figure 9:
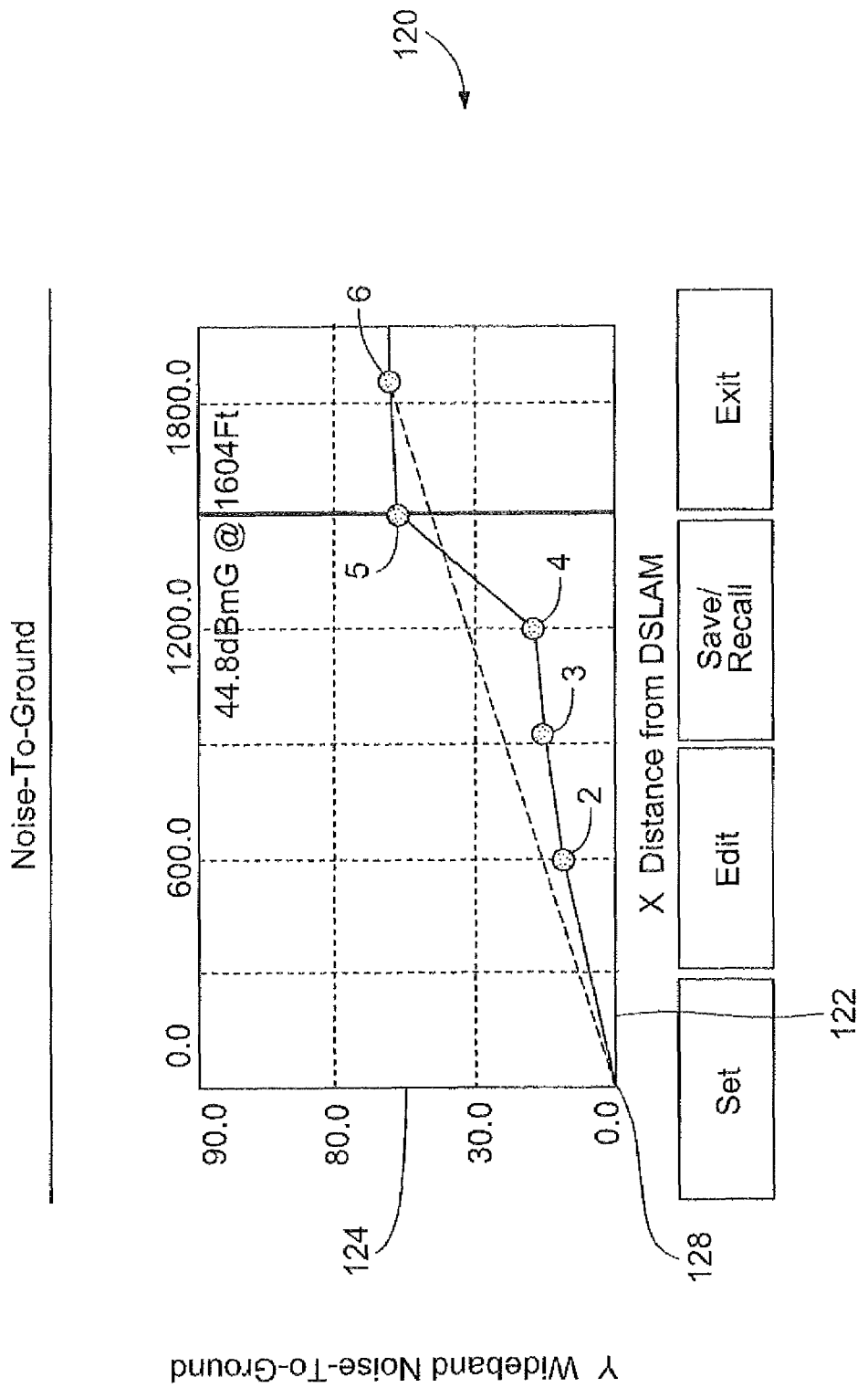
FIG. 9 illustrates a graph plotted by the test set in accordance with the method of the present invention.

The graph 120 shown in FIG. 9 is an example of a graph provided on the display 102 of the test set 100. The X axis 122 of the graph 120 represents the calculated distance from the cross-connect box 30 to the access point 38 and the Y axis 124 represents the measured Wideband. Noise-to-Ground. The graph 120 includes data points 2, 3, 4, 5, 6, relating to measurements recorded at the second, third, fourth, fifth, and sixth access points 38 shown in FIGS. 5 and 6. The test set 100 is configured such that if the technician moves a cursor 126 to a particular data point on the graph, the data associated with that particular data point will be displayed. For example, as shown in FIG. 9, the technician has located the cursor 126 over data point 5. The display provides that at data point 5, the wide band noise-to-ground level is 44.8 dBrnG, and the reading was taken at a calculated distance of 1504 ft from the cross-connect box 30. It is noted that the indication of "G" in the noise-to-ground-level reading indicates that a type G filter was used when making the measurements.

As illustrated on the graph 120, the wide band noise-to-ground reading at the origin 128 of the graph is approximately zero, indicating that the noise to ground measurement at the cross-connect box 30, i.e. where the reference pair has been terminated and shorted to ground, is essentially zero. As can be observed by the technician, a gradual rise is provided in the noise to ground measurements from the origin through data points 2, 3, and 4. The gradual slope from the origin through data point 4 indicates good shield bonding from the cross-connect box 30 to the fourth access point 38. As can also be observed by the technician, a steep rise is provided between the data point 4 and data point 5, indicating therefore an open shield or poor shield bonding between the fourth and fifth access points 38. Because an open is located on the shield 42, no shield current is provided along the shield between the fourth and fifth access points 38 and the wideband noise-ground measurement (NgW) will begin rising rapidly at the power bonded pedestal/access point before the open 82 (here the fourth access point 38). The elevated wideband noise-to-ground measurements will continue rising rapidly and will stop rising rapidly only when the technician passes the open 82 and reaches a properly bonded section of the cable 22, i.e. the noise-to-ground measurements stop rising rapidly at the section of cable 22 extending between the fifth and sixth access points 38. Observation of the graph 120, therefore, advises the technician that the open or poorly bonded shield can be found between the fourth and fifth access points. It is noted that regardless of whether the shield 42 is open at the start (e.g. near the fourth access point 38), the middle or the end of a section 58 (e.g. near the fifth access point 38), a steep rise in the wideband noise-to-ground measurement will be illustrated in FIG. 9.

Using this graphical data, therefore, a technician can very easily identify the fourth and fifth access points 38 as the access points of interest and can isolate the shield trouble between the fourth and fifth access points 38. Upon determining that the location of the shield trouble exists between the fourth and fifth access points 38, the technician can further confirm this conclusion by comparing the Measured Local Ground Resistance and the Computed Shield Resistance relating to each of these access points 38. As noted above the Computed Shield Resistance and the Measured Local Ground Resistance are recorded in the table at each access point. The measured Local Ground is computed as described above and compared to the Computed Shield Resistance to determine whether the Measured Local Ground Resistance at each test location is acceptable. For example, if the Measured Local Ground Resistance is higher than the Computed Shield Resistance the technician will know that a problem exists with the shield 9 and confirmation of the graphical data can be made. In some instances, if a very high Measured Ground Resistance is provided relative to the Computed Shield Resistance with all bonds in place as the measurements are taken with the test set 100, a clamp-on AC ammeter can be used to confirm a very low current on the shield. The technician must, however, be careful not to open bonds that are carrying substantial AC current as doing so can knock down xDSL service and IPTV service in the cable.

Upon recognizing the portion of the graph having a steep incline, the technician can take additional readings from additional access points not shown in FIGS. 5 and 6 between the access points of interest, i.e. access points 4 and 5, to more precisely isolate the section of the cable 22 with shield trouble. The technician will also refer to the Measured Local Ground Resistance recorded at each data point to assist in this analysis.

Upon more precise isolation of the section of the cable, bonds not carrying current can now be opened for further testing with test set 100. With the RED and BLACK leads 104, 106 bridged onto the reference pair 40a, the GREEN lead 108 is used to test the resistance of each isolated section of cable shield 42. The screen will display the ohms in the connected shield 42 back to the ground at the cross-connect 30 where the reference pair 40a is grounded. The displayed resistance is the sum of the shield resistance in that section of the cable plus the resistance to earth of any ground rod(s) connected to the far end.

After identifying a section of cable with an open shield with the above process, the precise location of the open in the shield can be located with an open shield locator.

The methods of the present invention are summarized as follows:

A. Shield Integrity Test

1. Select a reference pair and short and ground the reference pair at the cross-connect-box 30. Preferably, this reference pair should extend to the farthest serving terminal on the cable in question.

2. Connect the test instrument 100 to the distribution cable 22 at a network interface device 34 or at an access point 38.
  a. Connect the RED and BLACK leads to the reference pair.
  b. Leaving the bond between the cable shield and the local ground in place, connect the GREEN lead to the local ground.
  c. If permitted by the terrain (e.g. if the area of the access point is not paved), connect the BLUE lead of the test set 100 to a temporary ground stake or screwdriver ground in earth placed away from the local ground. If placement of a temporary ground stake is not possible, the BLUE lead is not connected and the connection provided by the GREEN lead to the grounded cable shield is used as a ground reference).

3. Measure Loop Resistance and calculate Expected. Pair Loss.

4. Calculate Predicted Power Level based on anticipated modern output power.

5. Select the filter to be used. E.g. a V filter for noise-to-ground measurements taken in connection with VDSL service; a G-filter for noise-to-ground measurements taken in connection with ADSL service; or a C-filter for analyzing audible POTS voice band noise.
  6. Measure the Wideband Noise-To-Ground on the reference pair.
  7. Calculate Predicated Noise Metallic based on the Measure Wideband Noise-To-Ground and the Minimum Expected Pair Loss.
  8. Compute a predicted signal-to-noise ratio.
  9. Compare the signal to noise ratio to a threshold and display a GO/NO-GO indication.
    a. If a GO indication is displayed, the cable may not have bonding problems. Or you may have pair problems instead of bonding problems.
    b. If a NO GO indication is displayed bad shield bonding or an open in the shield is likely, so continue isolating the source of the noise by performing the shield trouble isolation method.
B. Shield Trouble Isolation Method
  1. Select a pair to be used as a reference pair and short and ground the reference pair at the cross connection box.
  2. Connect the test instrument to any access point along the distribution cable.
    a. Connect the RED and BLACK leads to the reference pair. The RED and BLACK leads should be bridged onto the pair without cutting the pair, for example, by using bed of nail clips.
    b. Leaving the bond between the cable shield and the local ground in place, connect the GREEN lead to the local ground.
    c. If permitted by the terrain (e.g. if the area of the access point is not paved), connect the BLUE lead of the test set 100 to a temporary ground stake or screwdriver ground in earth placed away from the local ground. If placement of a temporary ground stake is not possible, the BLUE lead is not connected and the connection provided by the GREEN lead to the grounded cable shield is used as a ground reference).
  3. Using the test instrument, take the following measurement and perform the necessary calculations to collect and record the following data:
    a. Record the measured Loop Ohms of the Reference Pair.
    b. Compute and record the distance out.
    c. Record the measured Wideband Noise-To-Ground of the Reference Pair.
    d. Record the computed shield resistance.
    e. Record the Measured Ground Resistance.
    f. Display the NgW data point on the Graph.
  4. Move the test instrument to a new access location and take the measurements and perform the necessary calculations to collect and record the data identified in step 3 above.
  5. Repeat step 4 for as many access points as desired by the technician.
  6. As data is collected and recorded, the test set 100 will automatically arrange the data relative to the distance from the cross-connect box 30.
  7. Utilizing the recorded data graph wideband noise-to-ground versus distance out on the test instrument 100.
  8. Analyze the graph to locate areas of rapidly increasing NgW as required to predict the location of the open shield or bad shield bonding section.
  9. Using the Measured Local Ground Resistance and the Computed Shield Resistance data confirm the predicted location of the open shield or bad shield bonding.
  10. Using a companion AC current clamp meter, verify no shield current is flowing in section of shield for the predicted location of the open shield or bad shield bonding.
  11. Open the shield bond at the predicted location of the bad shield.
  12. Pinpoint the location of the open shield with an open shield locator. Note that use of the open shield locator will require opening of the ground bond, however, this only needs to occur at a limited number of access points close to the predicted location (e.g. only those access point adjacent to the section of the cable which has been identified in the shield trouble isolation method as having trouble.
  13. Repair the open shield or shield bond. It is noted that cable shields work extremely well to cancel induction at 1 MHz and above. Such cable shields are, however, relatively poorly at 1 kHz. Thus, repairing had bonding and grounding will give a much more dramatic improvement in xDSL circuits than voice band telephone circuits (i.e. POTS circuits).

While preferred embodiments of the present invention are shown and described, it is envisioned that those skilled in the art may devise various modifications of the present invention without departing from the spirit and scope of the appended claims.

The invention claimed is:
1. A method for detecting the integrity of a cable shield of a distribution cable carrying telecommunication services to a subscriber, the distribution cable having a first end proximate a connection box, a second end opposite the first end, a plurality of pairs of conductors, each pair of conductors including a tip and a ring, and a shield; the method comprising the steps of:
  identifying a pair of conductors;
  shorting and grounding first ends of the tip and ring of said identified pair of conductors;
  providing a test instrument having a plurality of leads;
  electrically connecting a first lead of said test instrument to the second end of the tip;
  electrically connecting a second lead of said test instrument to the second end of said ring;
  electrically connecting a third lead of said test instrument to the shield of said cable, the shield of said cable electrically connected to ground;
  utilizing said test instrument to measure a loop resistance of the identified pair;
  utilizing said test instrument to calculate an expected pair loss of the identified pair based upon said measured loop resistance of the identified pair;
  utilizing the test instrument to identify a modem output power level;
  utilizing the test instrument to calculate a predicted signal level;
  utilizing said test instrument to measure a wideband noise-to-ground on the identified pair;
  utilizing said test instrument to calculate a predicted noise metallic based on said measured wideband noise-to-ground and a minimum expected pair balance;
  utilizing said test instrument to calculate and display a predicted signal-to-noise ratio based on said predicted signal level and said predicted noise metallic.
2. The method of claim 1, further including the steps of:
  comparing said predicted signal-to-noise ratio to a predetermined threshold; and
  wherein if said signal-to-noise ratio exceeds said predetermined threshold, a pass indication is displayed on said test instrument.
3. The method of claim 1, wherein a value of said minimum expected pair balance is provided to said test instrument from the technician.

4. The method of claim 1, wherein a value of said minimum expected pair balance is provided in a memory of said test instrument.

5. The method of claim 4, wherein the value of said minimum expected pair balance is approximately 50 dB.

6. The method of claim 1 wherein said test instrument includes a memory having data regarding a plurality of modems stored therein and a user interface allowing a user to select the type of modem used to modulate signals carried by the cable; and wherein said step of utilizing the test instrument to identify an output power level of the modem provides for selection a type modem from said data.

7. The method of claim 6, wherein upon selection of the modem used to modulate signals carried by the cable, a filter is selected for filtering the noise-to-ground measurement.

8. The method of claim 1, wherein said step of utilizing the test instrument to calculate a predicted signal level is provided by subtracting said expected pair loss from said modem output power level.

9. The method of claim 1, wherein said step of utilizing said test instrument to calculate a predicted noise metallic is provided by subtracting said minimum pair balance from the measured wideband noise-to-ground.

10. The method of claim 8, wherein said minimum pair balance is approximately 50 dB.

11. The method of claim 8, wherein said minimum pair balance is entered by the technician.

12. The method of claim 1, wherein said step of calculating said expected pair loss is further based upon the gauge of the conductors.

13. The method of claim 1, further comprising the step of electrically connecting a fourth lead of said test instrument to a ground stake spaced from said ground rod.

14. A method of identifying the location of trouble on the shield of a distribution cable, the distribution cable having a first end proximate the DSLAM a second end opposite the first end, the cable including a shield having a ground connection, a plurality of pairs of conductors, each pair including a tip and a ring, the cable further including a plurality of access locations along the length of the cable for accessing the pairs of conductors; the method comprising the steps of:
  identifying a reference pair of conductors;
  shorting and grounding first ends of said tip and ring of said reference pair;
  providing a test instrument having a plurality of leads and a memory for the storage of data;
  at first access location, electrically connecting said test instrument to said cable to be tested by electrically connecting a first lead of said test instrument to said tip, electrically connecting a second lead of said test instrument to said ring, and electrically connecting a third lead of said test instrument to the shield of said cable;
  measuring the loop resistance of the pair and storing said measured loop resistance in said memory of said test instrument;
  measuring the wideband noise to ground at the access location and storing said wideband noise to ground measurement in said memory of said test instrument;
  disconnecting said test instrument from the first location and re-connecting said test instrument at a subsequent access location;
  repeating said steps of measuring and storing said loop resistance, and measuring and storing the wideband noise to ground data at the access location;
  displaying the stored data associated with each access location such that the data is arranged based upon the measured loop resistance;
  analyzing said displayed data to determine if a large rate of change is provided between access locations; and
  identifying the access locations associated with the large rate of change as access locations of interest to isolate the predicted location of the shield problem between said access locations of interest.

15. The method of claim 14, further including the steps of:
  entering the gauge of the pair into the memory of said test instrument; and
  calculating the distance from the DSLAM to the access location based upon said measured loop resistance and storing said calculated distance in said memory of said test instrument.

16. The method of claim 15, further comprising the step of:
  displaying the data associated with each access location such that the data is arranged based upon the calculated distance.

17. The method of claim 14, wherein a ground rod is provided at said first access location and wherein said step of and electrically connecting said test instrument includes electrically connecting a fourth lead of said test instrument to a ground stake spaced from said ground rod.

18. The method of claim 14, further comprising the steps of:
  identifying an additional access location between said access locations of interest;
  connecting the test instrument at said additional access location and repeating said steps of measuring and storing said loop resistance, and measuring and storing wide band noise to ground data at the additional access location;
  displaying the stored data associated with said additional access location along with the stored data associated with the access locations, wherein the data is arranged based upon the calculated distance;
  analyzing said displayed data to locate a large rate of change between access locations; and
  identifying the access locations associated with the large rate of change to further isolate the predicted location of the shield problem between the identified access locations.

19. The method of claim 14, wherein said step of displaying includes providing a graph of loop resistance versus measured wideband noise to ground.

20. The method of claim 15, wherein said step of displaying includes providing a graph of calculated distance versus measured wideband noise to ground.

21. The method of claim 20, wherein said step of analyzing said displayed data includes observing the slope of the graph to identify areas where the slope of the graph increases rapidly.

22. The method of claim 14, further comprising the steps of:
  at each access location, measuring and storing data relating to the local ground resistance at the access location.

23. The method of claim 22, further comprising the steps of:
at each access location, calculating and storing data relating to the resistance of the shield from the access location to the DSLAM.

24. The method of claim 23, further comprising the step of confirming the predicted location of the shield trouble by comparing the measured local ground resistance at the predicted location of shield trouble and the computed shield resistance at the predicted location of shield trouble.

25. The method of claim 14, further comprising the step of utilizing an open shield locator within the predicted location of the shield problem to pinpoint the location of an open shield.

26. The method of claim 14, further comprising the step of selecting a filter to be used for taking the wideband noise-to-ground readings.

* * * * *